(12) United States Patent
Yeh

(10) Patent No.: US 9,651,793 B2
(45) Date of Patent: May 16, 2017

(54) LASER PULSE MODULATION DEVICE

(71) Applicants: Shenzhen China Star Optoelectronics Technology Co., Ltd., Guangdong (CN); Wuhan China Star Optoelectronics Technology Co., Ltd., Wuhan, Hubei (CN)

(72) Inventor: Yu-Chun Yeh, Guangdong (CN)

(73) Assignees: SHENZHEN CHINA STAR OPTOELECTRONICS TECHNOLOGY CO., LTD., Shenzhen, Guangdong (CN); WUHAN CHINA STAR OPTOELECTRONICS TECHNOLOYG CO., LTD., Wuhan, Hubei (CN)

( * ) Notice: Subject to any disclaimer, the term of this patent is extended or adjusted under 35 U.S.C. 154(b) by 53 days.

(21) Appl. No.: 14/648,048

(22) PCT Filed: Apr. 3, 2015

(86) PCT No.: PCT/CN2015/075931
§ 371 (c)(1),
(2) Date: May 28, 2015

(87) PCT Pub. No.: WO2016/155027
PCT Pub. Date: Oct. 6, 2016

(65) Prior Publication Data
US 2016/0291341 A1    Oct. 6, 2016

(30) Foreign Application Priority Data
Mar. 30, 2015  (CN) .......................... 2015 1 0145145

(51) Int. Cl.
| | |
|---|---|
| *G02B 27/14* | (2006.01) |
| *G02B 27/10* | (2006.01) |
| *G02B 27/28* | (2006.01) |
| *H01S 5/00* | (2006.01) |
| *H01S 5/40* | (2006.01) |

(52) U.S. Cl.
CPC ......... *G02B 27/283* (2013.01); *G02B 27/144* (2013.01); *H01S 5/0057* (2013.01); *H01S 5/0085* (2013.01); *H01S 5/4012* (2013.01)

(58) Field of Classification Search
CPC ............................ G02B 27/0905; G02B 27/10
USPC ......................................... 359/618, 629, 638
See application file for complete search history.

(56) References Cited

U.S. PATENT DOCUMENTS 6,391,022 B1 *   5/2002   Furumoto ............ A61B 18/203
                                                                128/898

* cited by examiner

*Primary Examiner* — William Choi
(74) *Attorney, Agent, or Firm* — Ladas & Parry LLP

(57) ABSTRACT

A laser pulse modulation device is disclosed and includes a first laser source, a second laser source, and a polarizing beam splitter. The first laser source is used to generate a first linearly-polarized pulsed laser beam which oscillates in a direction parallel to a propagation direction thereof. The second laser source is used to generate a second linearly-polarized pulsed laser beam which oscillates in a direction perpendicular to a propagation direction thereof. The polarizing beam splitter is used to overlay the first linearly-polarized pulsed laser beam and the second linearly-polarized pulsed laser beam to form a first combined pulsed laser beam.

18 Claims, 3 Drawing Sheets

LASER PULSE MODULATION DEVICE

BACKGROUND OF THE INVENTION

Field of the Invention

The present invention relates to the field of laser pulse modulation, and more particularly to a laser pulse modulation device.

Description of the Related Art

In the field of semiconductors, a high-temperature annealing process is usually employed to convert amorphous silicon to polysilicon, wherein a laser radiation method is generally used to rapidly raise the temperature of the amorphous silicon to a desired temperature.

However, if the user directly uses a laser pulse modulation device having a higher peak power to perform laser radiation on the amorphous silicon, a hydrogen explosion may occur and result in peeling of the produced polysilicon film, thereby affecting the production yield. If the user uses a laser pulse modulation device having a lower peak power to perform laser radiation on the amorphous silicon, the temperature on the surface of the amorphous silicon cannot be raised to the desired temperature in a short period of time and thus the laser radiation treatment has to be repeated multiple times to complete the conversion operation.

Therefore, it is necessary to provide a laser pulse modulation device to overcome the problems existing in the conventional technology.

SUMMARY OF THE INVENTION

A main object of the present invention is to provide a laser pulse modulation device that does not affect production yield and can be operated with less difficulty so as to solve the problems of conventional laser pulse modulation devices where a hydrogen explosion may easily occur and the operation of the device is quite difficult.

The prevent invention provides a laser pulse modulation device having:

a first laser source used to generate a first linearly-polarized pulsed laser beam which oscillates in a direction parallel to a propagation direction thereof;

a second laser source used to generate a second linearly-polarized pulsed laser beam which oscillates in a direction perpendicular to a propagation direction thereof;

a polarizing beam splitter used to overlay the first linearly-polarized pulsed laser beam and the second linearly-polarized pulsed laser beam to form a first combined pulsed laser beam;

a beam splitter used to split incident light into multiple first split laser beams and multiple second split laser beams; and a reflector assembly used to reflect the second split laser beams transmitted from the beam splitter back to the beam splitter; wherein a pulse-width of the first combined pulsed laser beam is greater than that of the first linearly-polarized pulsed laser beam, and the pulse-width of the first combined pulsed laser beam is greater than that of the second linearly-polarized pulsed laser beam; wherein the pulse-width of the first linearly-polarized pulsed laser beam is ranged from 20 nanoseconds to 200 nanoseconds.

In the laser pulse modulation device of the present invention, the reflector assembly includes multiple reflecting mirrors which are used to adjust a propagation direction of the second split laser beams.

In the laser pulse modulation device of the present invention, a plurality of the first split laser beams transmitted from the beam splitter overlay with each other to form a second combined pulsed laser beam.

In the laser pulse modulation device of the present invention, a pulse-width of the second combined pulsed laser beam is greater than that of the first combined pulsed laser beam.

In the laser pulse modulation device of the present invention, a transmittance of the beam splitter is ranged from 20% to 50%.

In the laser pulse modulation device of the present invention, a reflectivity of the beam splitter is ranged from 50% to 80%.

In the laser pulse modulation device of the present invention, the first linearly-polarized pulsed laser beam is transmitted by total transmission in the polarizing beam splitter.

In the laser pulse modulation device of the present invention, the second linearly-polarized pulsed laser beam is reflected by total internal reflection in the polarizing beam splitter.

In the laser pulse modulation device of the present invention, the pulse-width of the first linearly-polarized pulsed laser beam is equal to that of the second linearly-polarized pulsed laser beam.

In the laser pulse modulation device of the present invention, the time difference between a pulse starting time of the first linearly-polarized pulsed laser beam and that of the second linearly-polarized pulsed laser beam is shorter than the pulse-width.

The present invention further provides another laser pulse modulation device having:

a first laser source used to generate a first linearly-polarized pulsed laser beam which oscillates in a direction parallel to a propagation direction thereof;

a second laser source used to generate a second linearly-polarized pulsed laser beam which oscillates in a direction perpendicular to a propagation direction thereof; and a polarizing beam splitter used to overlay the first linearly-polarized pulsed laser beam and the second linearly-polarized pulsed laser beam to form a first combined pulsed laser beam; wherein a pulse-width of the first combined pulsed laser beam is greater than that of the first linearly-polarized pulsed laser beam, and the pulse-width of the first combined pulsed laser beam is greater than that of the second linearly-polarized pulsed laser beam.

In the laser pulse modulation device of the present invention, the laser pulse modulation device further has:

a beam splitter used to split incident light into multiple first split laser beams and multiple second split laser beams; and a reflector assembly used to reflect the second split laser beams transmitted from the beam splitter back to the beam splitter.

In the laser pulse modulation device of the present invention, the reflector assembly includes multiple reflecting mirrors which are used to adjust a propagation direction of the second split laser beams.

In the laser pulse modulation device of the present invention, a plurality of the first split laser beams transmitted from the beam splitter overlay with each other to form a second combined pulsed laser beam.

In the laser pulse modulation device of the present invention, a pulse-width of the second combined pulsed laser beam is greater than that of the first combined pulsed laser beam.

In the laser pulse modulation device of the present invention, a transmittance of the beam splitter is ranged from 20% to 50%, and a reflectivity of the beam splitter is ranged from 50% to 80%.

In the laser pulse modulation device of the present invention, the first linearly-polarized pulsed laser beam is transmitted by total transmission in the polarizing beam splitter; the second linearly-polarized pulsed laser beam is reflected by total internal reflection in the polarizing beam splitter.

In the laser pulse modulation device of the present invention, the pulse-width of the first linearly-polarized pulsed laser beam is equal to that of the second linearly-polarized pulsed laser beam.

In the laser pulse modulation device of the present invention, the time difference between a pulse starting time of the first linearly-polarized pulsed laser beam and that of the second linearly-polarized pulsed laser beam is shorter than the pulse-width.

In the laser pulse modulation device of the present invention, the pulse-width of the first linearly-polarized pulsed laser beam is ranged from 20 nanoseconds to 200 nanoseconds.

Compared with the conventional laser pulse modulation devices, the laser pulse modulation device of the present invention uses two laser sources to form a combined pulsed laser beam with an appropriate power and an appropriate pulse-width so as to enhance production yield and the device can be operated with less difficulty, thereby solving the technical problems of conventional laser pulse modulation devices where a hydrogen explosion easily occurs and the operation is quite difficult.

In order to make the contents of the present invention more easily understood, the preferred embodiments of the present invention are described in detail, in cooperation with accompanying drawings, as follows.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side, etc., are only directions with reference to the accompanying drawings, so that the used directional terms are used to describe and understand the present invention, but the present invention is not limited thereto.

Figure 1:
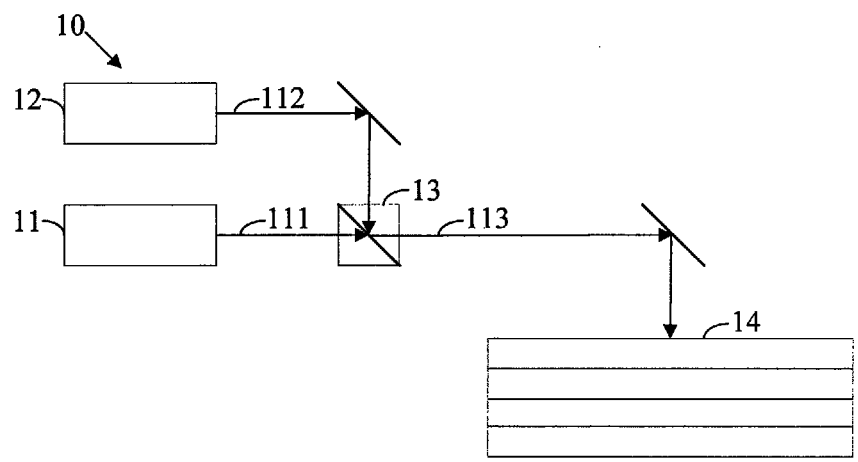
FIG. 1 is a schematic diagram of the structure of a laser pulse modulation device according to a first preferred embodiment of the present invention.

With reference to FIG. 1, FIG. 1 is a schematic diagram of the structure of a laser pulse modulation device according to a first preferred embodiment of the present invention. The laser pulse modulation device 10 of this preferred embodiment comprises a first laser source 11, a second laser source 1, and a polarizing beam splitter 13. The first laser source 11 is used to generate a first linearly-polarized pulsed laser beam 111 which oscillates in a direction parallel to a propagation direction thereof. The second laser source 12 is used to generate a second linearly-polarized pulsed laser beam 112 which oscillates in a direction perpendicular to a propagation direction thereof The first linearly-polarized pulsed laser beam 111 is transmitted by total transmission in the polarizing beam splitter 13, and the second linearly-polarized pulsed laser beam 112 is reflected by total internal reflection in the polarizing beam splitter 13 and thus the first linearly-polarized pulsed laser beam 111 and the second linearly-polarized pulsed laser beam 112 are combined together in the polarizing beam splitter 13 to form a first combined pulsed laser beam 113. Meanwhile, there is a time difference between the pulse starting time of the first linearly-polarized pulsed laser beam 111 and that of the second linearly-polarized pulsed laser beam 112, and therefore a pulse-width of the first combined pulsed laser beam 113 is simultaneously greater than that of the first linearly-polarized pulsed laser beam 111 and the second linearly-polarized pulsed laser beam 112.

Figure 2A:
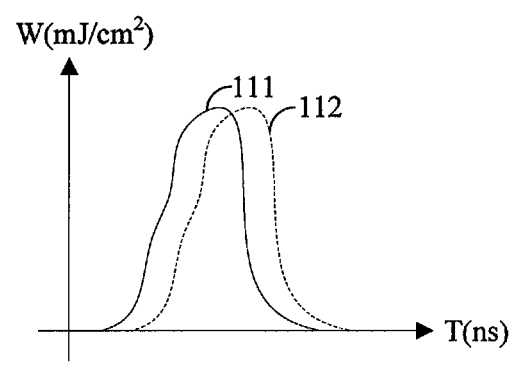
FIG. 2A is a laser pulse waveform diagram of the laser pulse modulation device according to the first preferred embodiment of the present invention.
Figure 2B:
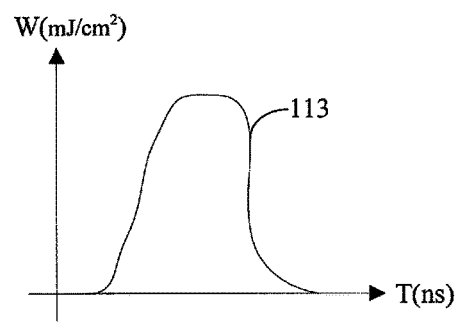
FIG. 2B is another laser pulse waveform diagram of the laser pulse modulation device according to the first preferred embodiment of the present invention.

With reference to FIG. 2A and FIG. 2B, FIG. 2A is a laser pulse waveform diagram of the laser pulse modulation device according to the first preferred embodiment of the present invention; FIG. 2B is another laser pulse waveform diagram of the laser pulse modulation device according to the first preferred embodiment of the present invention. In the present preferred embodiment, the pulse-width of the first linearly-polarized pulsed laser beam 111 is equal to that of the second linearly-polarized pulsed laser beam 112, and may be ranged from 20 nanoseconds to 200 nanoseconds, and is preferably from 25 nanoseconds to 80 nanoseconds. Taking a pulse-width of 20 nanoseconds as an example, the time difference between the pulse starting time of the first linearly-polarized pulsed laser beam 111 and the pulse starting time of the second linearly-polarized pulsed laser beam 112 is 10 nanoseconds. Specifically, as shown in FIG. 2A, the solid line waveform represents the waveform of the first linearly-polarized pulsed laser beam 111, and the dotted line waveform represents the waveform of the second linearly-polarized pulsed laser beam 112. The pulse-width of the first combined pulsed laser beam 113 formed by the polarizing beam splitter is 30 nanoseconds. Specifically, the implemented waveform as shown in FIG. 2B represents the waveform of the first combined pulsed laser beam 113.

When using the laser pulse modulation device 10 of the present preferred embodiment, the first laser source 11 generates the first linearly-polarized pulsed laser beam 111 which oscillates in a direction parallel to a propagation direction thereof, and the first linearly-polarized pulsed laser beam 111 is then directly transmitted to the polarizing beam splitter 13; the second laser source 12 generates the second linearly-polarized pulsed laser beam 112 which oscillates in a direction perpendicular to a propagation direction thereof, and the second linearly-polarized pulsed laser beam 112 is reflected by a reflecting mirror to the polarizing beam splitter 13. In the polarizing beam splitter 13, the first linearly-polarized pulsed laser beam 111 is transmitted by total transmission, and the second linearly-polarized pulsed laser beam 112 is reflected by total reflection, and then the first linearly-polarized pulsed laser beam 111 and the second linearly-polarized pulsed laser beam 112 are combined together to form a first combined pulsed laser beam 113. Eventually, the first combined pulsed laser beam 113 is irradiated onto an amorphous silicon layer 14 to form a desired polysilicon film.

The time difference between the pulse starting time of the first linearly-polarized pulsed laser beam 111 and that of the second linearly-polarized pulsed laser beam 112 can be adjusted so as to adjust the pulse-width of the first combined pulsed laser beam 113. For example, if the pulse-width of the first combined pulsed laser beam 113 is too large, the aforementioned time difference can be lowered to reduce the pulse-width of the first combined pulsed laser beam 113; if the pulse-width of the first combined pulsed laser beam 113 is too small, then the aforementioned time difference can be raised to increase the pulse-width of the first combined pulsed laser beam 113. Thus, the pulse-width and pulse peak of the first combined pulsed laser beam 113 can be adjusted correspondingly to a desired value.

The laser pulse modulation device of the present preferred embodiment uses two laser sources to form a combined pulsed laser beam with an appropriate power and an appropriate pulse-width, thereby enhancing the production yield and the device can be operated with less difficulty.

Figure 3:
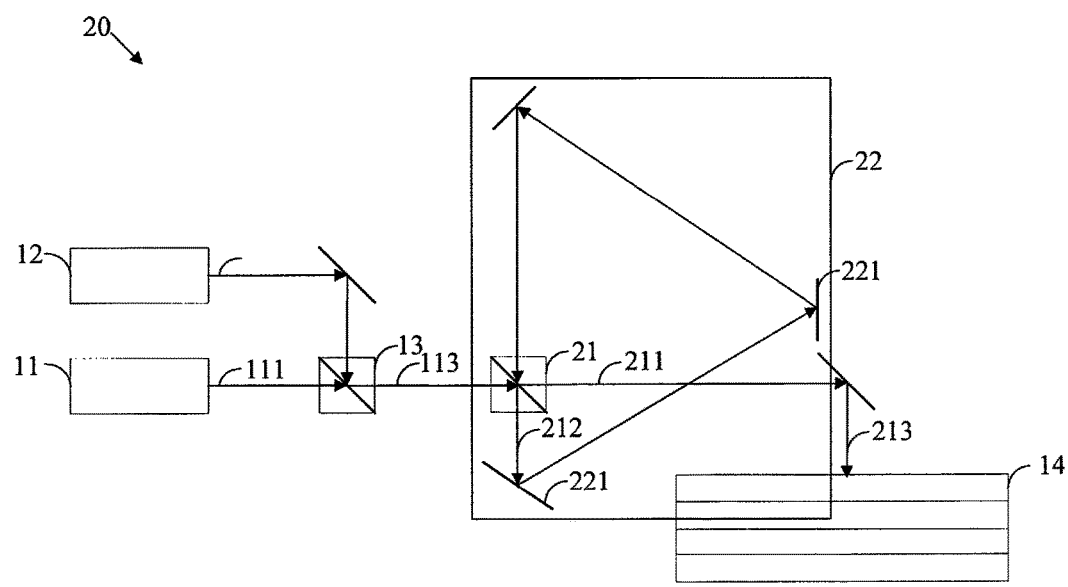
FIG. 3 is a schematic diagram of the structure of a laser pulse modulation device according to a second preferred embodiment of the present invention.

With reference FIG. 3, FIG. 3 is a schematic diagram of the structure of a laser pulse modulation device according to a second preferred embodiment of the present invention. On the basis of the first preferred embodiment, the laser pulse modulation device 20 of the second preferred embodiment further comprises a beam splitter 21 and a reflector assembly 22. The beam splitter 21 is used to split incident light into multiple first split laser beams 211 and multiple second split laser beams 212. A transmittance of the beam splitter 21 is preferably ranged from 20% to 50%; and a reflectivity of the beam splitter 21 is preferably ranged from 50% to 70%. The reflector assembly 22 is used to reflect the second split laser beams 212 transmitted from the beam splitter 21 back to the beam splitter. The reflector assembly 22 includes multiple reflecting mirrors 221 which are used to adjust a propagation direction of the second split laser beams 212.

Figure 4A:
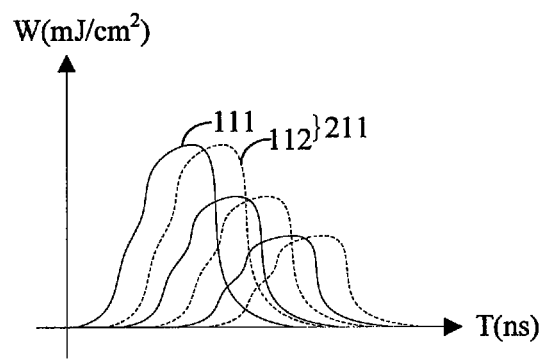
FIG. 4A is a laser pulse waveform diagram of the laser pulse modulation device according to the second preferred embodiment of the present invention.
Figure 4B:
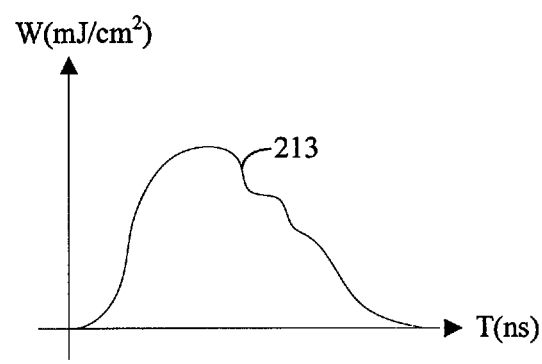
FIG. 4B is another laser pulse waveform diagram of the laser pulse modulation device according to the second preferred embodiment of the present invention.

With further reference to FIGS. 4A and 4B, FIG. 4A is a laser pulse waveform diagram of the laser pulse modulation device according to the second preferred embodiment of the present invention; and FIG. 4B is another laser pulse waveform diagram of the laser pulse modulation device according to the second preferred embodiment of the present invention. In this second preferred embodiment, the pulse-width of the first linearly-polarized pulsed laser beam 111 is equal to that of the second linearly-polarized pulsed laser beam 112, such as 20 nanoseconds. The time difference between the pulse starting time of the first linearly-polarized pulsed laser beam 111 and the pulse starting time of the second linearly-polarized pulsed laser beam 112 may be 10 nanoseconds. Specifically, as shown in FIG. 4A, the solid line waveform represents the waveform of the first linearly-polarized pulsed laser beam 111 after being processed by the beam splitter 21 and the reflector assembly 22, and the dotted line waveform represents the waveform of the second linearly-polarized pulsed laser beam 112 after being processed by the beam splitter 21 and the reflector assembly 22.

The pulse-width of the first combined pulsed laser beam 113 formed by the polarizing beam splitter is 30 nanoseconds. Specifically, the implemented waveform as shown in FIG. 2B represents the waveform of the first combined pulsed laser beam 113. The laser beams in FIG. 4 are combined together to form a second combined pulsed laser beam 213. The pulse-width of the second combined pulsed laser beam 213 may be ranged from 50 nanoseconds to 80 nanoseconds. Specifically, the implemented waveform as shown in FIG. 4B represents the waveform of the second combined pulsed laser beam 213.

When using the laser pulse modulation device 20 of the present preferred embodiment, the first laser source 11 generates the first linearly-polarized pulsed laser beam 111 which oscillates in a direction parallel to a propagation direction thereof, and the first linearly-polarized pulsed laser beam 111 then is directly transmitted to the polarizing beam splitter 13. The second laser source 12 generates the second linearly-polarized pulsed laser beam 112 which oscillates in a direction perpendicular to a propagation direction thereof, and the second linearly-polarized pulsed laser beam 112 is reflected by a reflecting mirror to the polarizing beam splitter 13. In the polarizing beam splitter 13, the first linearly-polarized pulsed laser beam 111 is transmitted by total transmission, and the second linearly-polarized pulsed laser beam 112 is reflected by total reflection, and then the first linearly-polarized pulsed laser beam 111 and the second linearly-polarized pulsed laser beam 112 are combined together to form a first combined pulsed laser beam 113.

Subsequently, the first combined pulsed laser beam 113 is transmitted to the beam splitter 21, and the beam splitter 21 splits the incident first combined pulsed laser beam 113 into multiple first split laser beams 211 and multiple second split laser beams 212, wherein the first split laser beams 211 are directly irradiated onto the amorphous silicon layer 14; the second split laser beams 211 are transmitted to the beam splitter 21 again by the reflecting mirrors of the reflector assembly 22, and the beam splitter 21 then again performs light-splitting to the second split laser beams 211. After performing the light-splitting multiple times, a plurality of the first split laser beams 211 are formed (as shown in FIG. 4) and transmitted from the beam splitter 21 to combine together to form a second combined pulsed laser beam 213 (as shown in FIG. 4B). Eventually, the second combined pulsed laser beam 213 is irradiated onto the amorphous silicon layer 14 to form a desired polysilicon film.

From FIG. 4A and FIG. 4B, the cooperation of the beam splitter 21 and the reflector assembly 22 can expand the pulse-width of the second combined pulsed laser beam 213 and lower the pulse peak of the second combined pulsed laser beam 213 in a better way so that the pulse-width of the second combined pulsed laser beam 213 is greater than the pulse-width of the first combined pulsed laser beam 113. Such a conversion operation is quite simple and is able to avoid the occurrence of hydrogen explosion so as to form a higher-quality polysilicon film.

The laser pulse modulation device of the present invention uses two laser sources to form a combined pulsed laser beam with an appropriate power and an appropriate pulse-width so as to enhance production yield and the device can be operated with less difficulty. The present invention thus can solve the technical problems of conventional laser pulse modulation devices where a hydrogen explosion easily occurs and the operation is quite difficult.

The present invention has been described with preferred embodiments thereof, and it is understood that many changes and modifications to the described embodiment can be carried out without departing from the scope and the spirit of the invention that is intended to be limited only by the appended claims.

What is claimed is:

1. A laser pulse modulation device comprising:
a first laser source used to generate a first linearly-polarized pulsed laser beam which osculates in a direction parallel to a propagation direction thereof;
a second laser source used to generate a second linearly-polarized pulsed laser beam which oscillates in a direction perpendicular to a propagation direction thereof;
a polarizing beam splitter used to overlay the first linearly-polarized pulsed laser beam and the second linearly-polarized pulsed laser beam to form a first combined pulsed laser beam;
a beam splitter used to split incident light into multiple first split laser beams and multiple second split laser beams; and
a reflector assembly used to reflect the second split laser beams transmitted from the beam splitter back to the beam splitter; wherein
a pulse-width of the first combined pulsed laser beam is greater than that of the first linearly-polarized pulsed laser beam, and the pulse-width of the first combined pulsed laser beam is greater than that of the second linearly-polarized pulsed laser beam; wherein
the pulse-width of the first linearly-polarized pulsed laser beam is ranged from 20 nanoseconds to 200 nanoseconds.

2. The laser pulse modulation device as claimed in claim 1, wherein the reflector assembly includes multiple reflecting mirrors which are used to adjust a propagation direction of the second split laser beams.

3. The laser pulse modulation device as claimed in claim 1, wherein a plurality of the first split laser beams transmitted from the beam splitter overlay with each other to form a second combined pulsed laser beam.

4. The laser pulse modulation device as claimed in claim 3, wherein a pulse-width of the second combined pulsed laser beam is greater than that of the first combined pulsed laser beam.

5. The laser pulse modulation device as claimed in claim 1, wherein a transmittance of the beam splitter is ranged from 20% to 50%.

6. The laser pulse modulation device as claimed in claim 1, wherein a reflectivity of the beam splitter is ranged from 50% to 80%.

7. The laser pulse modulation device as claimed in claim 1, wherein the first linearly-polarized pulsed laser beam is transmitted by total transmission in the polarizing beam splitter.

8. The laser pulse modulation device as claimed in claim 1, wherein the second linearly-polarized pulsed laser beam is reflected by total reflection in the polarizing beam splitter.

9. The laser pulse modulation device as claimed in claim 1, wherein the pulse-width of the first linearly-polarized pulsed laser beam is equal to that of the second linearly-polarized pulsed laser beam.

10. The laser pulse modulation device as claimed in claim 9, wherein the time difference between a pulse starting time of the first linearly-polarized pulsed laser beam and that of the second linearly-polarized pulsed laser beam is shorter than the pulse-width.

11. A laser pulse modulation device comprising:
a first laser source used to generate a first linearly-polarized pulsed laser beam which oscillates in a direction parallel to a propagation direction thereof;
a second laser source used to generate a second linearly-polarized pulsed laser beam which oscillates in a direction perpendicular to a propagation direction thereof; and
a polarizing beam splitter used to overlay the first linearly-polarized pulsed laser beam and the second linearly-polarized pulsed laser beam to form a first combined pulsed laser beam;
a beam splitter used to split incident light into multiple first split laser beams and multiple second split laser beams; and
a reflector assembly used to reflect the second split laser beams transmitted from the beam splitter back to the beam splitter; wherein
a pulse-width of the first combined pulsed laser beam is greater than that of the first linearly-polarized pulsed laser beam, and the pulse-width of the first combined pulsed laser beam is greater than that of the second linearly-polarized pulsed laser beam.

12. The laser pulse modulation device as claimed in claim 11, wherein the reflector assembly includes multiple reflecting mirrors which are used to adjust a propagation direction of the second split laser beams.

13. The laser pulse modulation device as claimed in claim 11, wherein a plurality of the first split laser beams transmitted from the beam spatter overlay with each other to form a second combined pulsed laser beam.

14. The laser pulse modulation device as claimed in claim 13, wherein a pulse-width of the second combined pulsed laser beam is greater than that of the first combined pulsed laser beam.

15. The laser pulse modulation device as claimed in claim 11, wherein a transmittance of the beam splitter is ranged from 20% to 50%, and a reflectivity of the beam splitter is ranged from 50% to 80%.

16. The laser pulse modulation device as claimed in claim 11, wherein the first linearly-polarized pulsed laser beam is transmitted by total transmission in the polarizing beam splitter; the second linearly-polarized pulsed laser beam is reflected by total internal reflection in the polarizing beam splitter.

17. The laser pulse modulation device as claimed in claim 11, wherein the pulse-width of the first linearly-polarized pulsed laser beam is equal to that of the second linearly-polarized pulsed laser beam.

18. The laser pulse modulation device as claimed in claim 17, wherein the time difference between a pulse starting time of the first linearly-polarized pulsed laser beam and that of the second linearly-polarized pulsed laser beam is shorter than the pulse-width.

* * * * *